(12) United States Patent
Horio et al.

(10) Patent No.: US 7,985,630 B2
(45) Date of Patent: Jul. 26, 2011

(54) METHOD FOR MANUFACTURING SEMICONDUCTOR MODULE

(75) Inventors: Masafumi Horio, Matsumoto (JP); Tatsuo Nishizawa, Matsumoto (JP); Eiji Mochizuki, Matsumoto (JP); Rikihiro Maruyama, Matsumoto (JP)

(73) Assignee: Fuji Electric Device Technology Co., Ltd., Tokyo (JP)

( * ) Notice: Subject to any disclaimer, the term of this patent is extended or adjusted under 35 U.S.C. 154(b) by 0 days.

(21) Appl. No.: 12/926,304

(22) Filed: Nov. 9, 2010

(65) Prior Publication Data

US 2011/0059581 A1 Mar. 10, 2011

Related U.S. Application Data

(62) Division of application No. 12/149,114, filed on Apr. 28, 2008, now Pat. No. 7,902,653.

(30) Foreign Application Priority Data

May 18, 2007 (JP) ................................ 2007-132572

(51) Int. Cl.
*H01L 21/00* (2006.01)

(52) U.S. Cl. . 438/124; 438/126; 438/127; 257/E21.499; 257/E21.5; 257/E21.501; 257/E21.502; 257/E21.503

(58) Field of Classification Search .................. 438/124, 438/126, 127; 257/E21.499, 5, 501–503
See application file for complete search history.

(56) References Cited

U.S. PATENT DOCUMENTS

2003/0094682 A1* 5/2003 Shinohara et al. ............ 257/685
* cited by examiner

*Primary Examiner* — Kiesha R Bryant
*Assistant Examiner* — Minchul Yang
(74) *Attorney, Agent, or Firm* — Manabu Kanesaka (57) ABSTRACT

A method for manufacturing a semiconductor module, includes the steps of preparing a board; mounting a semiconductor device on the second metal foil; placing a resin case onto the board for surrounding a first metal foil, an insulating sheet, the second metal foil, and the semiconductor device; pouring a resin in a paste form into the case to fill a space relative to the first metal foil, insulating sheet, the second metal foil and the semiconductor device; and heat-curing the resin. A bottom end of a peripheral wall of the case is located above a bottom surface of the first metal. The bottom surface of the first metal foil and the resin form a flat bottom surface to contact an external mounting member.

6 Claims, 7 Drawing Sheets

METHOD FOR MANUFACTURING SEMICONDUCTOR MODULE

CROSS-REFERENCE TO RELATED APPLICATIONS

The present application is a divisional of U.S. Ser. No. 12/149,114 filed on Apr. 28, 2008 now U.S. Pat. No. 7,902,653. The application claims priority to Japanese patent application number 2007-132572 filed on May 18, 2007, which is incorporated by reference in its entirety.

BACKGROUND OF THE INVENTION AND RELATED ART STATEMENT

This invention relates to a method for manufacturing a semiconductor module mounted with a power semiconductor device.

In inverter devices, uninterruptible power supply devices, machining equipments, industrial robots, and other equipments, semiconductor modules, which are independent of the main unit of the equipment, are employed.

Figure 7:
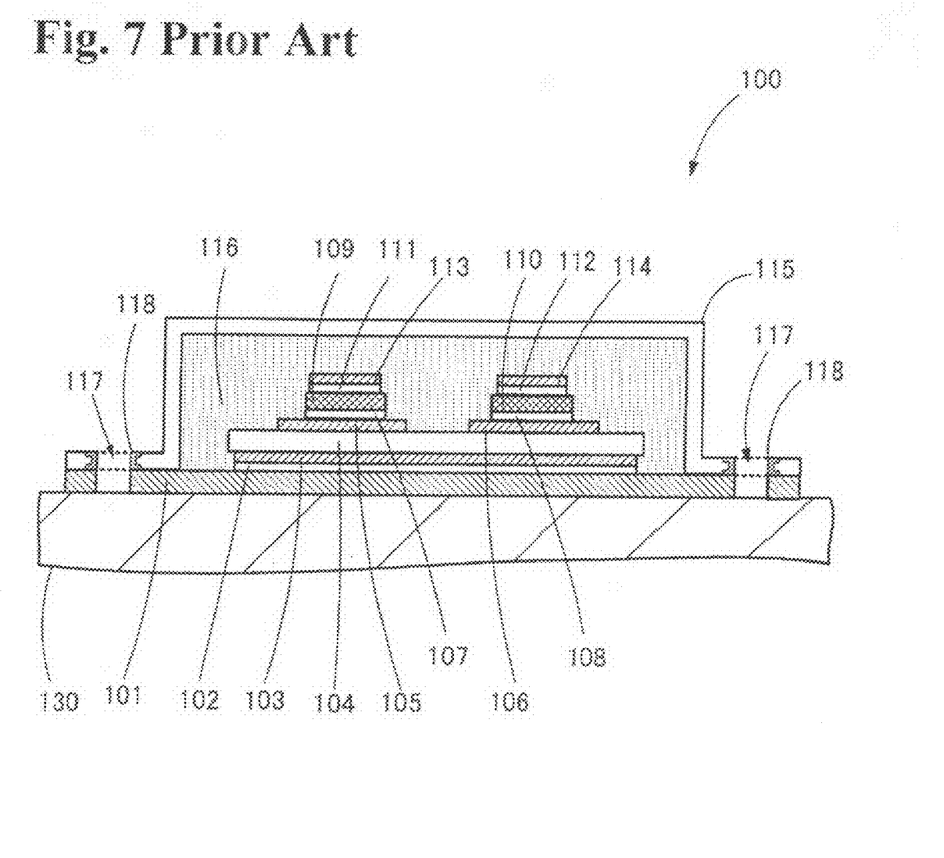
FIG. 7 is a schematic diagram of a conventional semiconductor module employing a metal base plate as the foundation.

As the construction of such semiconductor modules, generally, a metal base plate of prescribed thickness is used as a foundation, and a package mounted with power semiconductor devices is provided on the metal base plate (see for example Japanese Unexamined Patent Publication No. 2003-289130). For example, FIG. 7 is a schematic diagram of a semiconductor module employing a metal base plate as a foundation.

This semiconductor module 100 employs a metal base plate 101 with several millimeters in thickness as a foundation. Metal foil 103 is mounted onto the metal base plate 101 through a solder layer 102. An insulating sheet 104 is mounted onto the metal foil 103. And metal foils 105, 106 are mounted onto the insulating sheet 104. Further, on the metal foils 105, 106 are mounted semiconductor devices 109, 110, through solder layers 107, 108. Here, the semiconductor devices 109, 110 are, for example, IGBTs (Insulated Gate Bipolar Transistors), FWDs (Free Wheeling Diodes), or other devices. And, onto the semiconductor devices 109, 110 are mounted heat spreaders 113, 114, through solder layers 111, 112. A resin case 115, molded so as to surround the semiconductor devices 109, 110 and the like, is fixed onto the upper edge of the metal base plate 101.

Although not shown, metal wires, lead frames, and similar are arranged on the periphery of the semiconductor devices 109 and 110; for example, electrodes of the semiconductor devices 109, 110 are electrically mounted to a circuit pattern formed on the insulating sheet 104, or, electrical connections are formed between electrodes of the semiconductor devices 109, 110.

Further, the interior of the resin case 115 is filled with a gel 116, in order to prevent contact between metal wires and similar, and to protect the semiconductor devices 109, 110, and similar from moisture, humidity, and dust.

A cooling member 130 is positioned below the semiconductor module 100, bolts or similar are passed through holes 117 provided in the resin case 115 and metal base plate 101, and the metal base plate 101 is brought into close contact with the cooling member 130 by tightening the bolts or similar.

There are cases in which the resin case 115 is damaged in the vicinity of the holes 117 by tightening the bolts or similar. In order to prevent such damage, reinforcing metal rings 118 are provided on the inside of the holes 117 in the resin case 115.

However, such a semiconductor module 100 employs a thick metal base plate 101 as a foundation, so that the weight and size of the semiconductor module cannot be decreased.

Hence, there has been disclosed a small-size semiconductor module which does not use a metal base plate 101 as a foundation (see for example Komatsu, Saotome and Igawa, "Small-capacitance IGBT module", *Fuji Jihou*, Vol. 78, No. 4, 2005, pp. 260-263).

Figure 8:
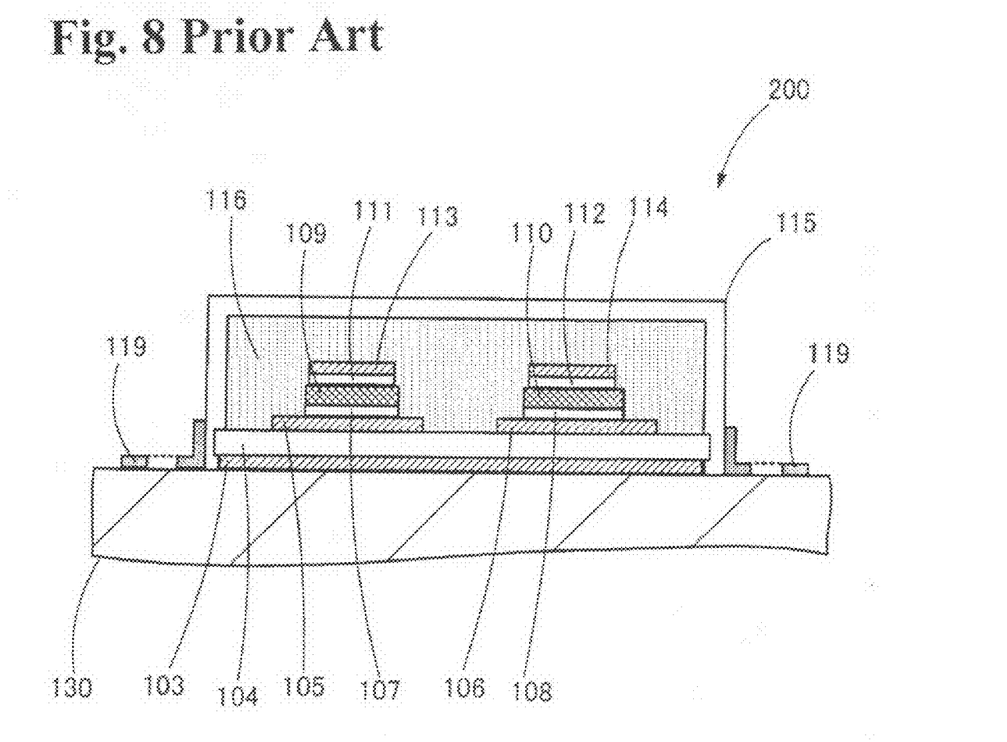
FIG. 8 is a schematic diagram of a conventional semiconductor module not employing a metal base plate.

FIG. 8 is a schematic diagram of a semiconductor module which does not use a metal base plate.

This semiconductor module 200 is based on an insulating sheet 104, metal foil 103 formed below the insulating sheet 104, and metal foils 105, 106 formed above the insulating sheet 104. Onto the metal foils 105, 106 are mounted semiconductor devices 109, 110, through solder layers 107, 108. In this type of semiconductor module 200, a resin case 115, molded so as to surround the semiconductor devices 109, 110, is fixed onto the upper edge of the insulating sheet 104. The interior of the resin case 115 is similarly filled with a gel 116 comprising a silicone material.

By means of such a semiconductor module 200, a thick metal base plate needs not be used as a foundation, so that the semiconductor module can be made lighter and more compact, and costs can be reduced.

Further, in a semiconductor module 200 of this type where there is no metal base plate, a metal hook 119 for installation is separately provided on a side portion of the resin case 115. A bolt or similar penetrates the metal hook 119, and the semiconductor module 200 is fixed to the cooling member 130 by tightening the bolt or similar.

However, in the construction of a semiconductor module 200 shown in FIG. 8, a soft gel 116, comprising a silicone material, is used as the sealing material in the resin case 115.

When a bolt is used to firmly fasten the semiconductor module 200 sealed with such a gel 116 on the cooling member 130, excessive amount of stress is applied to the insulating sheet 104 within the semiconductor module 200, and in some cases the insulating sheet 104 is damaged. That is, because the gel 116 is soft, deformation (distortion) of the insulating sheet 104 cannot be avoided. As a result, the insulating sheet 104 is damaged.

In order to avoid such damage, the semiconductor module 200 must be fastened to the cooling member 130 in such a range that there is no damage to the insulating sheet 104. Hence, in this structure of a semiconductor module 200, the metal foil 103 cannot be firmly brought into close contact with the cooling member 130. As a result, there has been a problem that an adequate cooling effect cannot be obtained.

Moreover, in the semiconductor module 200, heat is dissipated each time the semiconductor devices 109, 110 are operated, and this heat also causes deformation of the insulating sheet 104. Hence, as the semiconductor module 200 is used over a long period of time, deformation of the insulating sheet 104 repeatedly occurs. As a result, there has been a problem that the solder layers 107, 108 immediately below the semiconductor devices 109, 110 peel away.

Further, in such a semiconductor module 200, the thickness of the insulating sheet 104 is increased in order to secure adequate mechanical strength (for example, approximately 0.6 mmt or greater).

However, in a semiconductor module 200 using such a thick insulating sheet 104, there is a limit as to the thermal conductivity from the lower faces of the semiconductor devices 109, 110 to the cooling member 130. For this reason, there has been a problem that high-power semiconductor devices could not be incorporated into such semiconductor modules 200.

Also, this structure for a semiconductor module 200 necessitates the additional manufacturing step of separately installing a metal hook 119 for installation of the resin case 115.

Further objects and advantages of the invention will be apparent from the following description of the invention.

SUMMARY OF THE INVENTION

In order to achieve the objectives stated above, the invention provides a semiconductor module comprising an insulating sheet; a first metal foil mounted to a first main face of the insulating sheet; at least one second metal foil mounted to a second main face of the insulating sheet; at least one semiconductor device mounted onto the second metal foil; a resin case which surrounds the first metal foil, insulating sheet, second metal foil, and semiconductor device above the lower face of the first metal foil; and resin which is filled into the space between the inner surface of the resin case and the outer peripheral-edge face of the first metal foil and the outer faces of the insulating sheet, second metal foil, and semiconductor device. A flat face, which can be brought into close contact with an external mounting member, is formed by the lower face of the first metal foil and the resin exposed from the resin case.

Further, this invention provides a method for manufacturing a semiconductor module. The method includes the steps of: preparing a board having an insulating sheet, a first metal foil mounted to a first main face of the insulating sheet, and at least one second metal foil mounted to a second main face of the insulating sheet; mounting at least one semiconductor device on the second metal foil; placing a resin case which surrounds the first metal foil, insulating sheet, second metal foil, and semiconductor device above the lower face of the first metal foil, onto the board; pouring resin in paste form into the space between the inner face of the resin case and the outer peripheral-edge face of the first metal foil and the outer faces of the insulating sheet, second metal foil, and semiconductor device; and heat-curing the resin, wherein a flat face, which can be brought into close contact with an external mounting member, is formed by the lower face of the first metal foil and the resin exposed from the resin case.

According to the semiconductor module and method for manufacturing the semiconductor module, the first metal foil is mounted to the first main face of the insulating sheet, at least one second metal foil is mounted to the second main face of the insulating sheet, and at least one semiconductor device is mounted onto the second metal foil. And, the first metal foil, insulating sheet, second metal foil, and semiconductor device are surrounded by a resin case above the lower face of the first metal foil. The space between the inner face of the resin case and the outer peripheral-edge face of the first metal foil and the outer faces of the insulating sheet, second metal foil, and semiconductor device is filled with resin. And, a flat face is formed which can be brought into close contact with an external mounting member by the lower face of the first metal foil and the resin exposed from the resin case.

In a semiconductor module and a method for manufacturing a semiconductor module of this invention, a first metal foil is mounted to a first main face of an insulating sheet, at least one second metal foil is mounted to a second main face of the insulating sheet, and at least one semiconductor device is mounted onto the second metal foil. And, a resin case surrounds the first metal foil, insulating sheet, second metal foil, and semiconductor device above the lower face of the first metal foil, and resin is filled into the space between the inner face of the resin case and the outer peripheral-edge face of the first metal foil and the outer faces of the insulating sheet, second metal foil, and semiconductor device. Moreover, a flat face is formed which can be brought into close contact with an external mounting member by the lower face of the first metal foil and the resin exposed from the resin case.

By this means, a semiconductor module and a method for manufacturing a semiconductor module can be made such that the semiconductor module mounted with power semiconductor devices is light in weight, small in size, and low in cost, has an adequate cooling effect, and can be mounted with high-power semiconductor devices.

DETAILED DESCRIPTION OF THE PREFERRED EMBODIMENTS

Below, the invention is explained in detail, referring to the drawings.

First, the configuration of a semiconductor module is explained.

Figure 1A:
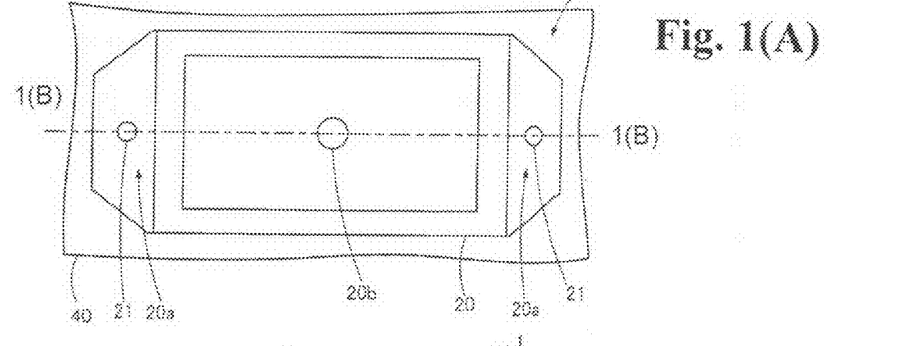
FIGS. 1(A), 1(B), 1(C) are schematic diagrams of principal portions, explaining the configuration of a semiconductor module.
Figure 1B:
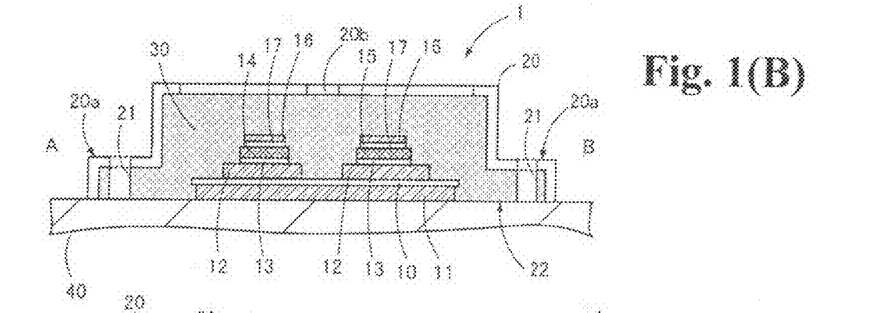
Figure 1C:
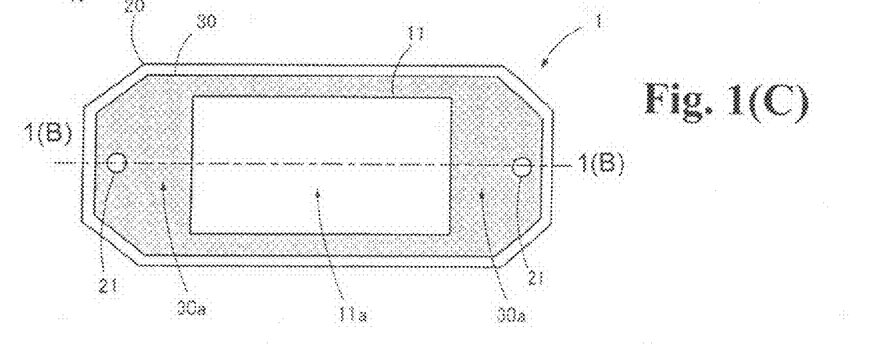

FIGS. 1(A), 1(B), 1(C) are schematic diagrams of principal portions, explaining the configuration of a semiconductor module. Here, in FIG. 1(A), a schematic top view of principal portions of a semiconductor module 1 is shown, and in FIG. 1(B), a schematic diagram of a cross-section of principal portions of the semiconductor module 1 is shown. In FIG. 1(C), a schematic bottom view of principal portions of the semiconductor module 1 is shown.

Also, in FIG. 1(B), a cross-sectional view taken along a line 1(B)-1(B) in FIGS. 1(A) and 1(C) is shown. In FIGS. 1(A), 1(B), a state is shown in which a cooling member 40 (cooling fins), which is the external mounting member, is mounted to the lower face of the semiconductor module 1. In FIG. 1(C), however, the cooling member 40 is not shown in order to clearly display the lower face of the semiconductor module 1.

In the semiconductor module 1 shown, a board is formed of a rectangular insulating sheet 10, metal foil 11 formed by a DCB (Direct Copper Bonding) method on the lower face of the insulating sheet 10, and at least one other metal foil 12 (in FIG. 1, two metal foils 12) formed by the same DCB method on the upper face of the insulating sheet 10. At Semiconductor devices 14, 15 are mounted onto the metal foils 12 with a tin (Sn)-silver (Ag)-based lead-free solder layer 13 intervening. Here, the insulating sheet 10 is, for example, formed from an alumina ($Al_2O_3$) sintered ceramic, and the metal foils 11, 12 are formed from metal whose main component is copper (Cu). The semiconductor devices 14, 15 are for example IGBT devices, FWD devices, power MOSFETs (Metal Oxide Semiconductor Field Effect Transistors), or other power semiconductor devices.

Further, heat spreaders 16, whose main component is copper, are mounted, via a solder layer 17 of the same component, onto the surface electrodes (not shown) arranged on the upper faces of the semiconductor devices 14, 15.

In the semiconductor module 1, an insulating sheet with thickness approximately 0.35 mmt or less is used as the insulating sheet 10 in order to shorten the heat dissipation path from the lower faces of the semiconductor devices 14, 15 to the upper face of the cooling member 40. Further, the thickness of the metal foils 11, 12 mounted to the main faces of the insulating sheet 10 is thicker than that of the metal foils 103, 105, 106 shown in FIG. 7 and FIG. 8, for example, 0.5 to 0.6 mm.

In FIGS. 1(A), 1(B), 1(C), particularly, although not shown, a plurality of semiconductor devices other than the semiconductor devices 14, 15 (for example, IGBT devices, FWD devices, power MOSFETs, and similar) is mounted on the insulating sheet 10, and in addition to the metal foils 12, a plurality of electrode terminals and similar is arranged on the insulating sheet 10. On the periphery of the semiconductor devices 14, 15 are arranged metal wires, lead frames, and similar, to electrically connect, for example, the electrodes of the semiconductor devices 14, 15 and respective metal foils, or to connect the electrodes of the semiconductor devices 14, 15 to each other using metal wires.

Further, a molded resin case 20 is provided on the semiconductor module 1, so as to surround the metal foil 11, insulating sheet 10, metal foils 12, semiconductor devices 14, 15, and heat spreader 16, above the lower face 11a of the metal foil 11.

Here, the material of the resin case 20 is, for example, PPS (polyphenylene sulfide). Further, fastening portions 20a for bolting are provided on a side portion of the resin case 20 so as to enable installation of the semiconductor module 1 on the cooling member 40. The fastening portions 20a are integrally molded with the resin case 20, and extend outward from side faces of the resin case 20.

A highly rigid epoxy resin 30 is filled (sealed) into the space between the inner face of the resin case 20 and the outer peripheral-edge face of the metal foil 11 and the outer faces of the insulating sheet 10, metal foils 12, semiconductor devices 14, 15, and heat spreader 16. However, the lower face of the metal foil 11 is exposed from the epoxy resin 30.

This epoxy resin 30 is poured into a resin-inflow opening 20b provided in the center of the upper face of the resin case 20, to seal the semiconductor devices 14, 15, insulating sheet 10, and similar (details are explained below). Further, the epoxy resin 30 is filled so as to enter into the interior of the fastening portions 20a. Holes 21, through which bolts or other screw portions are to be passed, are formed penetrating the fastening portions 20a and the epoxy resin 30 inside the fastening portions 20a.

The epoxy resin 30 is filled up to the same height as the lower face 11a of the metal foil 11. And, a broad flat face 22 is formed by an outer face 30a formed by epoxy resin 30 exposed from the resin case 20 and the lower face 11a of the metal foil 11. That is, the flat face 22, in which the outer face 30a of epoxy resin 30 is combined with the lower face 11a of the metal foil 11, becomes the bottom face of the semiconductor module 1. By providing this flat face 22, the semiconductor module 1 can be brought into firm and close contact with the cooling member at the bottom face. The above-described epoxy resin 30 comprises an inorganic filler, which is not shown.

Further, in the semiconductor module 1, the thermal expansion coefficient of the epoxy resin 30 is adjusted so as to match, as much as possible, the thermal expansion coefficients of the metal foils 11, 12. For example, if the thermal expansion coefficient of the metal foils 11, 12, formed from copper is approximately 16.5 ppm/K, then the thermal expansion coefficient of the epoxy resin 30 filled into the resin case 20 is approximately 15 ppm/K. By this means, when, for example, the semiconductor module 1 is operating, even if expansion and contraction of the metal foils 11, 12 occur, there is no occurrence of local stresses on the insulating sheet 10 or on the semiconductor devices 14, 15 because the thermal expansion coefficients are matched.

Also, whereas the thermal conductivity of the silicone gel used in the past as a sealing material is approximately 0.3 W/mK, the thermal conductivity of the epoxy resin 30 filled into the resin case 20 is adjusted to approximately 1 W/mK. Hence, heat generated by the semiconductor devices 14, 15 in the semiconductor module 1 is dissipated on the side of the cooling member 40, and is also dissipated on the side of the epoxy resin 30. As a result, heat generated by the semiconductor devices 14, 15 is dispersed above the semiconductor module 1 and in lateral directions, and so the semiconductor module 1 has a greater cooling effect.

The semiconductor module 1 is mounted to the cooling member 40 by passing bolts or similar through the holes 21 and fixing to the cooling member 40.

In order to further promote the cooling effect, a thermal compound (not shown) or similar may be applied between the bottom face of the semiconductor module 1 and the upper face of the cooling member 40.

By means of this construction of the semiconductor module 1, the outer faces of the insulating sheet 10, metal foils 11, 12, and semiconductor devices 14, 15 are backed by highly rigid epoxy resin 30.

Specifically, a highly rigid epoxy resin 30 is filled into the space between the inner face of the resin case 20 and the outer peripheral-edge face of the metal foil 11 and the outer faces of the insulating sheet 10, metal foils 12, and semiconductor devices 14, 15. And, a broad flat face 22 is formed by means of an outer face 30a formed of epoxy resin 30 exposed from the resin case 20 and the lower face 11a of the metal foil 11. Further, this flat face 22 is brought into contact with the upper face of the cooling member 40.

A fastening portion 20a, integrally formed with the resin case 20, extends from a side face of the resin case 20, and the interiors of the fastening portions 20a are also filled with highly rigid epoxy resin 30.

By means of this construction of the semiconductor module 1, by passing bolts or similar through the holes 21 provided in a side portion of the resin case 20, the entirety of the semiconductor module 1 can be firmly fastened by the bolt or similar to the cooling member 40. And, by means of this firm fastening, the flat face 22 and the upper face of the cooling member 40 can be brought into firm and close contact. As a result, a greater cooling effect can be secured for the semiconductor module 1.

Because a broad flat face 22 is formed on the semiconductor module 1, even when the entirety of the semiconductor module 1 is firmly fastened to the cooling member 40 by means of a bolt or similar, the contact pressure is uniformly distributed over the flat face 22. As a result, even when the entirety of the semiconductor module 1 is firmly fastened to the cooling member by means of a bolt or similar, there is no occurrence of local stresses in the insulating sheet 10, deformation of the insulating sheet 10 is suppressed, and damage to the insulating sheet 10 is prevented.

Also, even when heat generated during operation of the semiconductor devices 14, 15 would cause deformation of the insulating sheet 10, deformation of the insulating sheet 10 during operation of the semiconductor devices 14, 15 is suppressed, and damage to the insulating sheet 10 is prevented because stresses occurring within the insulating sheet 10 are distributed within the epoxy resin 30 as described above.

Further, peeling and similar of the solder layer 13 immediately below the semiconductor devices 14, 15 can also be prevented because deformation of the insulating sheet 10 is suppressed.

The interiors of the fastening portions 20a are filled with the highly rigid epoxy resin 30, and the strength thereof is reinforced. Hence, even when bolts or similar are directly passed through the holes 21 and firmly tightened, damage to the fastening portions 20a does not occur. For this reason, there is no need to provide a metal ring 118 on the inside of the holes 21 for reinforcement, as shown in FIG. 7.

In the semiconductor module 1, a thick metal base plate 101 is not used as in the case of the semiconductor module 200 shown in FIG. 7. As a result, the semiconductor module can be made lighter and more compact, and costs can be reduced.

In the semiconductor module 1, an insulating sheet 10, which is thinner than in the semiconductor module 200 shown in FIG. 8, is used, and still thinner metal foils 11, 12 are used. Hence, a greater cooling effect is obtained in the case of the semiconductor module 1 than the semiconductor module 200. As a result, the semiconductor devices 14, 15 in the semiconductor module 1 can operate with greater stability.

Further, because the cooling effect of the semiconductor module 1 is enhanced, it is possible to mount a semiconductor more powerful, compared to the semiconductor module 200.

Specifically, comparing the structure of PIMs (Power Integrated Modules) configured in the circuitry of inverters, converters and brakes, and structures (6-in-1 structures) where six pairs of IGBTs and FWDs connected in parallel in inverter circuits are combined in one package, the structure of a semiconductor module 200 enables mounting of semiconductor devices with a current rating at 1200V of up to 15 A in the case of a PIM structure, and a current rating at 1200 V of up to 35 A in the case of a 6-in-1 structure. Whereas, when employing the structure of the semiconductor module 1, semiconductor devices can be mounted with a current rating at 1200 V of up to 35 A in the case of a PIM structure, and with a current rating at 1200 V of up to 50 A in the case of a 6-in-1 structure.

Further, in the semiconductor module 1, holes 21 with high rigidity are provided in a side portion of the resin case 20, so that there is no need to separately provide a metal hook 119 for protection, as in the semiconductor module 200 shown in FIG. 8. As a result, semiconductor module manufacturing processes can be shortened, and costs can be reduced.

Next, a method for manufacturing the semiconductor module 1 is explained. In the following drawings, members which are the same as in FIGS. 1(A), 1(B),1(C) are assigned with the same symbols, and detailed explanations thereof are omitted.

Figure 2:
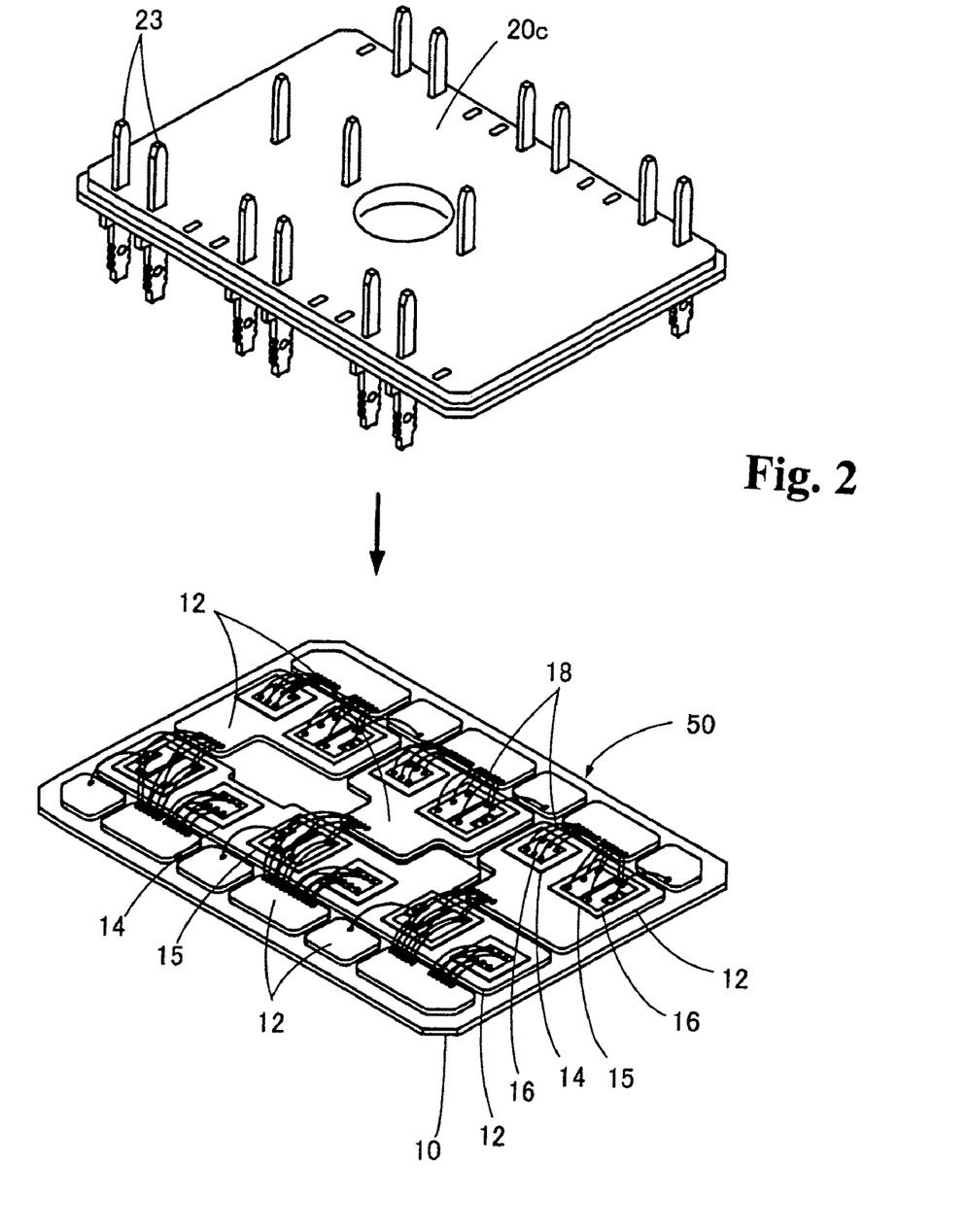
FIG. 2 is a first diagram explaining a process in a semiconductor module manufacturing method.

FIG. 2 is used to explain one process in the method for manufacturing a semiconductor module.

First, as shown in FIG. 2, a board 50 is prepared in such a way that at least one metal foil 12 is mounted by the DCB method onto an insulating sheet 10. Then, the semiconductor devices 14, 15 are mounted onto the metal foil 12 through a solder layer (not shown). Here, the material of the metal foil 12 includes copper, for example, as the main component, and is for example 0.5 to 0.6 mm thick. Then, a heat spreader 16 is mounted onto each of the main electrodes of the semiconductor devices 14, 15 through a solder layer (not shown). The heat spreaders 16 are electrically connected to the metal foils 12 by metal wires 18.

Patterned metal foil (copper of thickness 0.5 to 0.6 mm) is mounted to the lower face of the insulating sheet 10 in the board 50 by the DCB method, but this metal foil is not shown in the figure.

In FIG. 2, a lid portion 20c forming the upper lid of the resin case 20 is shown. A plurality of lead frames 23 for external connection terminals is arranged in advance so as to penetrate the main face of the lid portion 20c substantially in the direction perpendicular thereto.

After performing positioning of the lid portion 20c relative to the board 50, the lid portion 20c is moved in the direction of the arrow, to place the lid portion 20c onto the board 50 from above the board 50.

Figure 3:
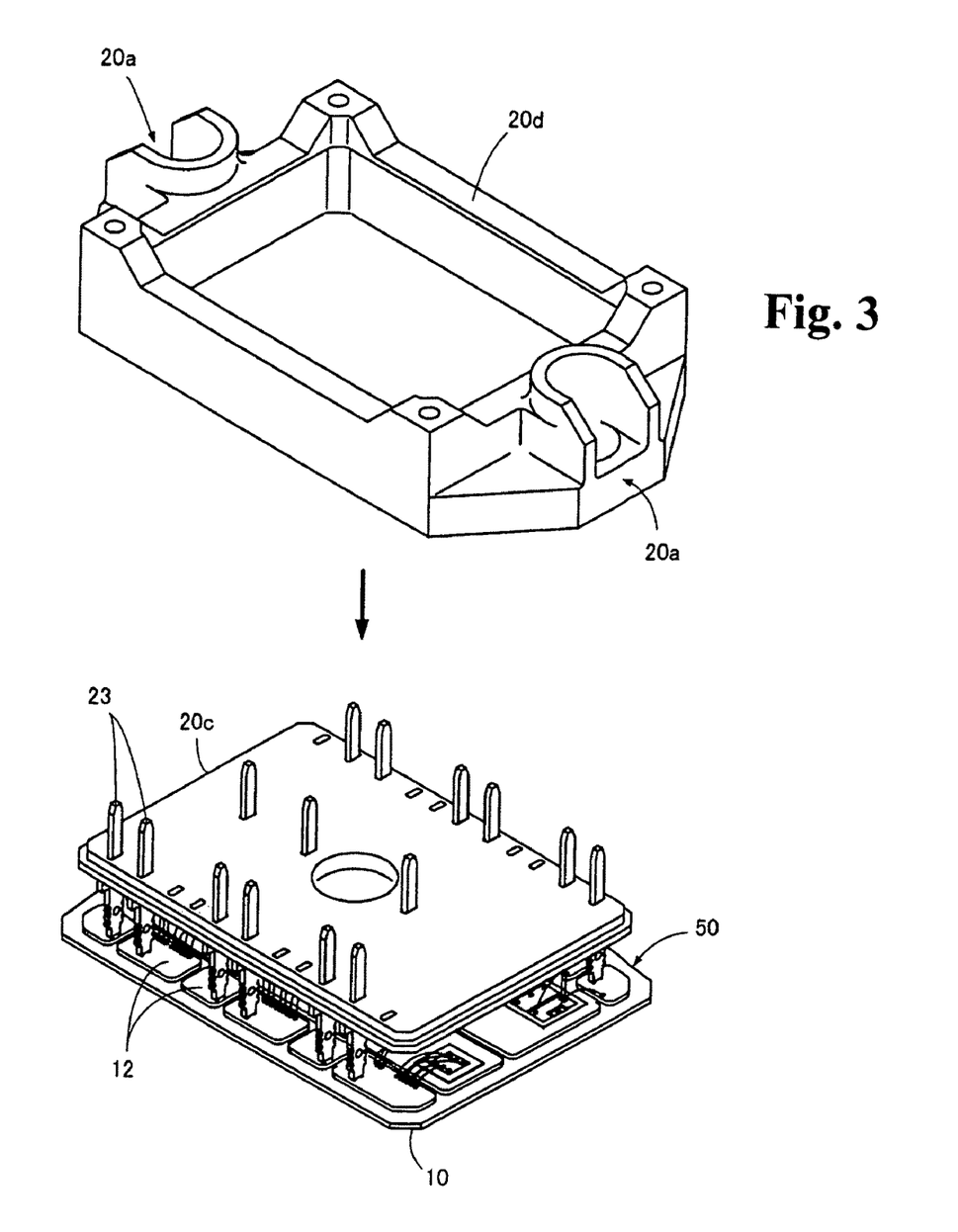
FIG. 3 is a second diagram explaining a process in a semiconductor module manufacturing method.

FIG. 3 explains one process in the method for manufacturing the semiconductor module.

As shown in FIG. 3, as a result of placing the lid portion 20c on the board 50, the plurality of lead frames 23 and the plurality of metal foils 12 on the board 50 are in contact. The portions to be in contact are soldered, so that the lead frames 23 are electrically connected to the respective metal foils 12. By mounting the lead frames 23 onto the respective metal foils 12, the lid portion 20c is fixed onto the board 50.

Next, as shown in FIG. 3, the outer frame portion 20d which forms a large portion of the resin case 20 is positioned above the board 50 and lid portion 20c. As stated above, this outer frame portion 20d has fastening portions 20a on the sides which are integrally formed.

Then, the outer frame portion 20d is moved in the direction of the arrow toward the board 50, and the outer frame portion 20d is mated with the board 50 and lid portion 20c from above.

Figure 4:
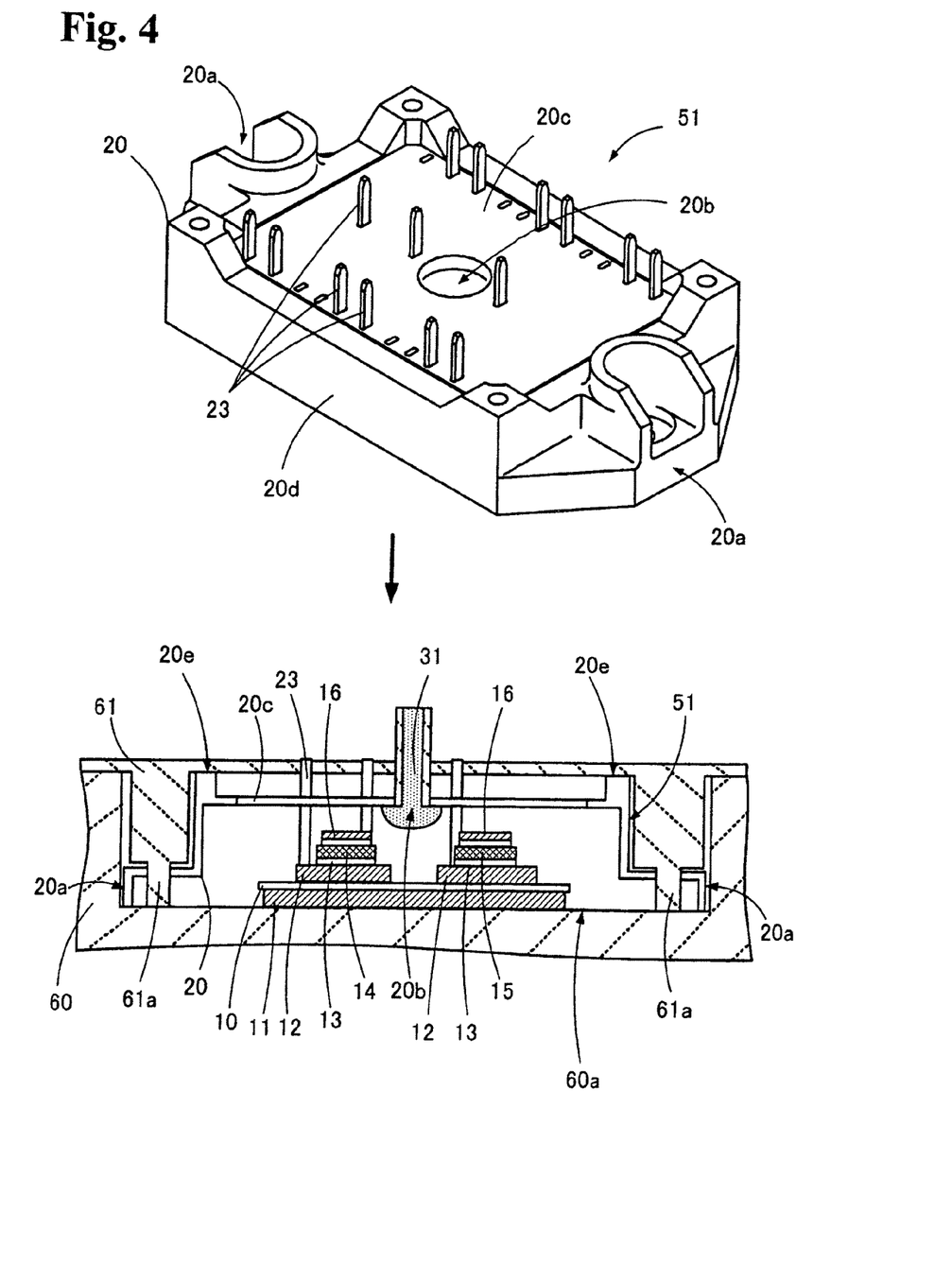
FIG. 4 is a third diagram explaining a process in a semiconductor module manufacturing method.

FIG. 4 explains one process in the method for manufacturing the semiconductor module.

In FIG. 4, a state where the outer frame portion 20d is mated with the board 50 and lid portion 20c is shown. In this state, on the side above the lower face of the metal foil, not shown, mounted to the lower face of the insulating sheet 10, the metal foil, insulating sheet 10, metal foils 12, semiconductor devices 14, 15, and heat spreaders 16 are surrounded by the resin case 20 (lid portion 20c, outer frame portion 20d).

Then, the mated member 51 is sandwiched between a lower jig 60 and upper jig 61 for molding, as shown in FIG. 4, and a heat-curing type epoxy resin 31 is poured into a resin-inflow opening 20b provided in the center of the lid portion 20c. At this stage, the epoxy resin 31 is in paste form.

When the epoxy resin 31 is poured into the resin-inflow opening 20b, the epoxy resin 31 flows into the space between the inner face of the resin case 20 and the outer peripheral-edge face of the metal foil 11 and the outer faces of the insulating sheet 10, metal foils 12, and semiconductor devices 14, 15, as well as the heat spreaders 16. In addition, the epoxy resin 31 is filled in the fastening portions 20a. The inner face 60a of the lower jig 60, which is in contact with the lower portion of the mated member 51, forms a broad flat face wider than the mated member 51.

Then, after completely pouring the epoxy resin 31 in paste form into the resin case 20, the mated member 51 is heated for a prescribed time at the curing temperature of the epoxy resin 31.

By means of this heat treatment, the epoxy resin 31 which has been poured into the resin case 20 is cured, and the highly rigid epoxy resin 30 shown in FIG. 1 seals the space between the inner face of the resin case 20 and some of the outer faces of the semiconductor devices 14, 15, insulating sheet 10, metal foils 11, 12, and heat spreaders 16.

Further, because the inner face of the lower jig 60 in contact with the mated member 51 is a flat face, a broad and flat bottom face is formed by the main face of the metal foil 11 and epoxy resin 31 exposed from the resin case 20.

During pouring the epoxy resin 31, circular column-shape protruding portions 61a provided on the upper jig 61 are inserted into holes formed in advance in the fastening portions 20a, and the tips of the protruding portions 61a are brought into contact with the lower jig 60. By this means, epoxy resin 31 does not flow into the portions where the protruding portions 61a are positioned, and after the epoxy resin 31 is cured, the holes 21 shown in FIG. 1 are formed.

Through these manufacturing processes, the semiconductor module 1 shown in FIGS. 1(A), 1(B), 1(C) is completed.

The metal foil 11 may be structured so as to have a lower-side convex shape in the bottom face.

For example, as shown in FIG. 4, at the uppermost contact face 20e of the resin case 20 making contact with the upper jig 61, the interior of the resin case 20 is filled with epoxy resin 31 while adjusting the force pressing on the contact face 20e by the upper jig 61. That is, the force with which the upper jig 61 presses against the contact face 20e is adjusted, and while causing distortion of the entirety of the mated member 51, the interior is filled with epoxy resin 31, and heat treatment is performed to cure the epoxy resin 31.

Figure 5:
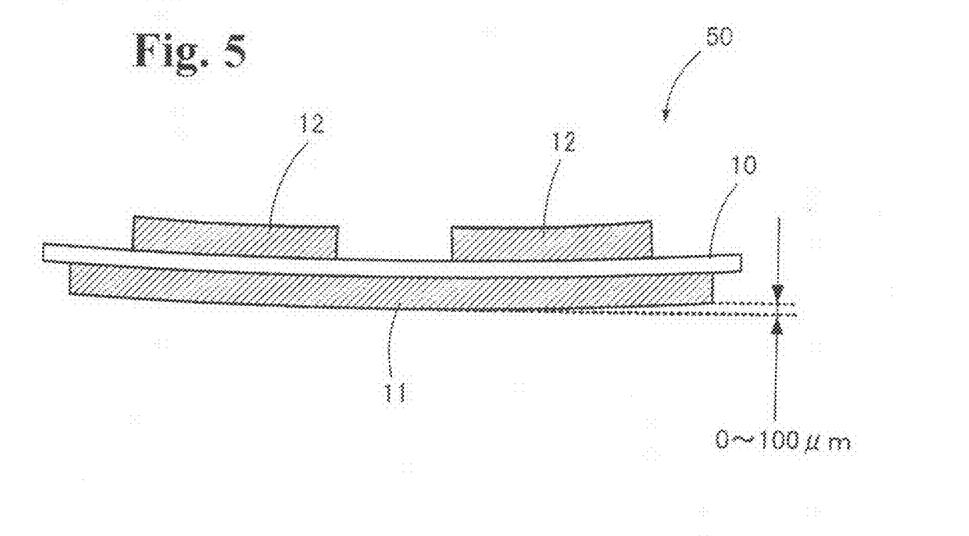
FIG. 5 explains the structure of a board deformed into a convex shape.

The state of a board 50 manufactured using this method is shown in FIG. 5.

FIG. 5 is used to explain the construction of a board distorted into a convex shape. In this figure, only the board 50 formed from the metal foils 11, 12 and insulating sheet 10 is shown, and other members such as the semiconductor devices 14, 15 are omitted.

As explained above, while forcibly distorting the entirety of the mated member 51, epoxy resin 31 is injected and cured to form convex-shape metal foil 11 on the lower side. The degree of warping is such that the outer edges of the metal foil 11 are distorted upwardly by 0 to 100 μm from the horizontal plane tangent at the center portion of the metal foil 11.

Immediately after placing the semiconductor module 1, provided with this convex-shape metal foil 11, on the cooling member 40, only the vicinity of the center portion of the metal foil 11 and the cooling member 40 are in contact. However, the metal foil 11 is made from metal so that it has an elasticity. Hence, by passing bolts or similar through the holes 21 positioned on side portions of the semiconductor module 1, and fastening the semiconductor module 1 to the cooling member 40 at the side portions, the contact plane between the metal foil 11 and the cooling member 40 is broadened gradually outwardly from the center portion, and ultimately the entire face of the metal foil 11 is brought into firm and close contact with the cooling member 40.

If the lower face of the metal foil 11 were deformed into a concave shape, the center portion of the metal foil 11 would not be in contact with the cooling member 40 even after fastening with bolts or similar.

By bonding such a convex-shape metal foil 11 to the semiconductor module 1, the metal foil 11 and cooling member 40 can be brought into firm and close contact, and the cooling effect of the semiconductor module 1 can be further promoted.

Finally, an example of deformation of the structure of the semiconductor module 1 is explained.

Figure 6:
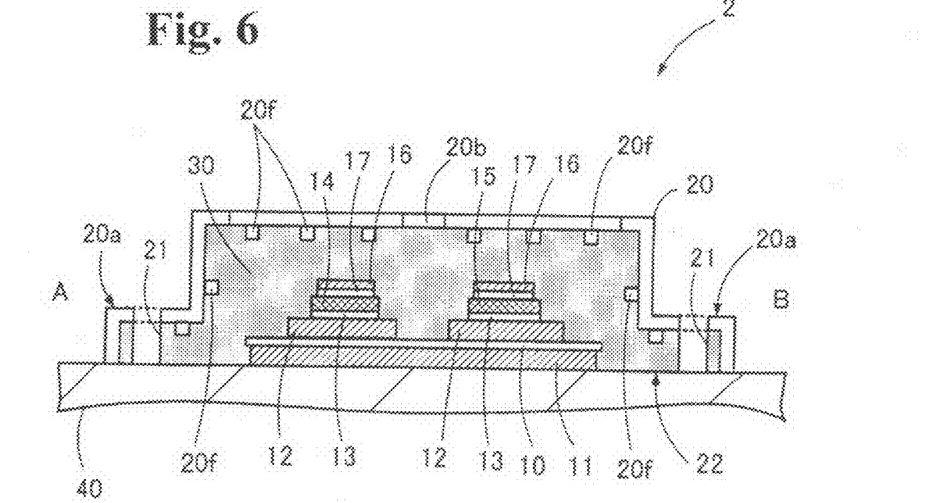
FIG. 6 is a schematic diagram of a cross-section of principal portions, explaining a modified example of a semiconductor module.

FIG. 6 is a schematic cross-sectional diagram of principal portions, explaining an example of deformation of a semiconductor module.

In the semiconductor module 2 shown in FIG. 6, at least one protruding portion 20f is provided on the inner face of the resin case 20, in order that the resin case 20 and epoxy resin 30 may be in firm and close contact by an "anchor effect". These protruding portions 20f are integrally formed with the resin case 20.

By this means, even when there is some difference in the thermal expansion coefficients of the resin case 20 and epoxy resin 30, the resin case 20 and epoxy resin 30 remain reliably in close contact due to the anchor effect of the protruding portions 20f. For example, even when the resin case 20 and epoxy resin 30 are heated due to operation of the semiconductor devices 14, 15, and there is a difference in the expansion and contraction of the resin case 20 and epoxy resin 30, due to this anchor effect, no slippage occurs at the interface between the resin case 20 and the epoxy resin 30. Further, no peeling occurs at the interface between the resin case 20 and the epoxy resin 30.

In the above, examples are explained in which the semiconductor modules 1, 2 are provided with heat spreaders 16. However, the invention is not limited to such a configuration, and heat spreaders do not have to be provided.

While the invention has been explained with reference to the specific embodiments of the invention, the explanation is illustrative and the invention is limited only by the appended claims.

What is claimed is:

1. A method for manufacturing a semiconductor module, comprising the steps of:
   preparing a board comprising a first metal foil, an insulating sheet mounted on a top surface of the first metal foil, and at least one second metal foil mounted on a top surface of the insulating sheet;
   mounting at least one semiconductor device on the at least one second metal foil;
   preparing a resin case having at least one integral fastening portion at a periphery thereof;
   placing the resin case having the least one integral fastening portion, onto the board for surrounding the first metal foil, insulating sheet, at least one second metal foil, and at least one semiconductor device, a bottom end of a peripheral wall of the resin case being located above a bottom surface of the first metal foil;
   pouring a resin in a flowable state, into the resin case to fill a space relative to the at least one fastening portion, the first metal foil, insulating sheet, at least one second metal foil and at least one semiconductor device while forming a through hole through the at least one fastening portion and a portion of the resin below the at least one fastening portion; and
   heat-curing the resin, wherein the bottom surface of the first metal foil and the resin form a flat bottom surface to contact an external mounting member.

2. A method for manufacturing a semiconductor module according to claim 1, further comprising:
   mounting a lid portion of the resin case having at least one lead frame on the board to contact with the at least one second metal foil;
   electrically connecting the lead frame and the at least one second metal foil; and
   placing an outer frame portion of the resin case on the board to enclose the lid portion.

3. A method for manufacturing a semiconductor module according to claim 1, wherein the first metal foil is convex toward the external mounting member after heat-curing step.

4. A method for manufacturing a semiconductor module according to claim 3, wherein an epoxy resin is injected and cured while entirety of a mated member is distorted forcibly.

5. A method for manufacturing a semiconductor module according to claim 1, further comprising, prior to the step of pouring the resin in the flowable state into the resin case, the step of setting the board comprising the first metal foil, the insulating sheet mounted on the top surface of the first metal foil and the at least one second metal foil mounted on the top surface of the insulating sheet, the semiconductor on the at least one metal foil, and the resin case having the at least one integral fastening portion at a periphery thereof, at an upper jig and a lower jig so that a protrusion on the upper jig extends through an opening in the at least one fastening portion to the lower jig so as to form the through hole when the resin is poured into the resin case.

6. A method for manufacturing a semiconductor module according to claim 5, further comprising:
- forming the lid of the resin case with a resin-inflow opening; and
- providing the upper jig with a filler tube which cooperates with the resin in-flow opening to deliver the resin in the flowable state, into the resin case.

* * * * *

UNITED STATES PATENT AND TRADEMARK OFFICE
CERTIFICATE OF CORRECTION

| | | |
|---|---|---|
| PATENT NO. | : 7,985,630 B2 | Page 1 of 1 |
| APPLICATION NO. | : 12/926304 | |
| DATED | : July 26, 2011 | |
| INVENTOR(S) | : Masafumi Horio et al. | |

It is certified that error appears in the above-identified patent and that said Letters Patent is hereby corrected as shown below:

Please change column 5, line 65, "the cooling member at the bottom face" to
--the cooling member 40 at the bottom face--.

Please change column 6, line 64, "the cooling member by means of a bolt or similar," to
--the cooling member 40 by means of a bolt or similar,--.

Signed and Sealed this
Nineteenth Day of June, 2012

David J. Kappos
*Director of the United States Patent and Trademark Office*